(12) United States Patent
Tong et al.

(10) Patent No.: US 6,317,297 B1
(45) Date of Patent: Nov. 13, 2001

(54) CURRENT PINNED DUAL SPIN VALVE WITH SYNTHETIC PINNED LAYERS

(75) Inventors: Hua-Ching Tong, San Jose; Xizeng Shi, Union City; Subrata Dey, Fremont; Matthew Richard Gibbons, Livermore, all of CA (US)

(73) Assignee: Read-Rite Corporation, Milpitas, CA (US)

( * ) Notice: Subject to any disclaimer, the term of this patent is extended or adjusted under 35 U.S.C. 154(b) by 0 days.

(21) Appl. No.: 09/413,287

(22) Filed: Oct. 6, 1999

(51) Int. Cl.[7] ................................................ G11B 5/39
(52) U.S. Cl. ....................... 360/314; 360/324.11
(58) Field of Search .................. 360/314, 324.11

(56) References Cited

U.S. PATENT DOCUMENTS

| 5,206,590 | 4/1993 | Dieny et al. . |
| 5,465,185 | 11/1995 | Hein et al. . |
| 5,768,069 | * 6/1998 | Mauri . |
| 6,219,209 | * 4/2001 | Gill ................................. 360/324.11 |

* cited by examiner

Primary Examiner—Craig A. Renner
(74) Attorney, Agent, or Firm—Sawyer Law Group LLP

(57) ABSTRACT

A method and system for providing a magnetoresistive sensor is disclosed. The method and system include providing a first pinned layer, providing a first spacer layer above the first pinned layer, and providing a free layer above the first spacer layer. The method and system further include providing a second spacer layer above the free layer and providing a second pinned layer above the second spacer layer. The first pinned layer includes a first magnetic layer and a second magnetic layer separated by a first nonmagnetic layer. The first magnetic layer is antiferromagnetically coupled with the second magnetic layer. The second pinned layer includes a third magnetic layer and a fourth magnetic layer separated by a second nonmagnetic layer. The third magnetic layer is antiferromagnetically coupled with the fourth magnetic layer. The first pinned layer and the second pinned layer are pinned by a current carried by the magnetoresistive head during use.

12 Claims, 8 Drawing Sheets

CURRENT PINNED DUAL SPIN VALVE WITH SYNTHETIC PINNED LAYERS

FIELD OF THE INVENTION

The present invention relates to magnetic recording technology, and more particularly to a giant magnetoresistive read head which is stable over a wide range of temperatures.

BACKGROUND OF THE INVENTION

Currently, magnetoresistive (MR) heads are currently used in read heads or for reading in a composite head. MR heads use an MR sensor in order to read data that has been stored in magnetic recording media. Giant magnetoresistance ("GMR") has been found to provide a higher signal for a given magnetic field. Thus, GMR is increasingly used as a mechanism for higher density MR sensors. One MR sensor which utilizes GMR to sense the magnetization stored in recording media is a conventional spin valve. A conventional spin valve includes two magnetic layers, a free layer and a pinned layer, a spacer layer, and a conventional antiferromagnetic (AFM) layer. The conventional spin valve may also include a capping layer. The spacer layer separates the free layer from the pinned layer. The magnetization of the pinned layer is typically fixed by exchange coupling to the conventional AFM layer.

More recently, conventional dual spin valves have been developed. For example, a conventional dual spin valve is disclosed in U.S. Pat. No. 5,287,238. A conventional dual spin valve typically includes a first AFM layer, a pinned layer on the first AFM layer, a spacer layer, a free layer on the spacer layer, a second pinned layer on the free layer, and a second AFM layer on the second pinned layer. The pinned layers and the free layer are still magnetic layers. The magnetization of the first and second pinned layers is fixed by an exchange coupling with the first and second AFM layers, respectively. Because there are more interfaces between the spacer layers and the magnetic (pinned and free) layers, the conventional dual spin valve has more scattering surfaces. As a result, the conventional dual spin valve has a higher MR.

In order to use the conventional spin valve or the conventional dual spin valve as a conventional MR sensor, current is passed through the conventional MR sensor as the MR head is brought in proximity to a recording media. Based on the information stored in the recording media, the resistance of the conventional MR sensor can change. Thus, the conventional MR sensor can be used to read the data stored by the recording media.

Because the conventional spin valve has a higher MR than anisotropic MR sensors, it has a higher signal. A conventional spin valve is preferred over anistropic MR sensors for higher densities. The conventional dual spin valve has an even higher MR than the conventional spin valve. Thus, the conventional dual spin valve is preferred for many applications.

Although the conventional spin valve and conventional dual spin valves are usable, there are drawbacks to each. The magnetizations of the pinned layers in both the conventional spin valve and the conventional dual spin valve are pinned due to a magnetic coupling with the antiferromagnetic layers. This coupling between the antiferromagnetic layers and the pinned layers is stable only up to approximately the blocking temperature of the antiferromagnetic material used. Above this temperature, the antiferromagnetic layers cannot effectively pin the magnetizations of the pinned layers. Thus, from approximately the blocking temperature and above, the conventional spin valve and conventional dual are not stable. Thus, the range of temperatures at which the conventional spin valve and conventional dual spin valve is limited.

Furthermore, the magnetizations of the pinned layers in the conventional spin valve and the conventional dual spin valve create a magnetostatic field in the region of the free layer. This field is present even when no current is passed through the MR sensor. When current is passed through a conventional spin valve, the magnetic field at the free layer changes based on the current. Although the current driven through the conventional spin valve can offset the pinned layer's magnetic field at the free layer, this offset occurs only at a particular current. If the current varies significantly from the proper current, the response of the conventional spin valve due to external magnetic fields will not be symmetric around a zero external magnetic field. The pinned layer thickness and the current must be optimized in order to produce symmetric behavior near the optimal current. In a conventional dual spin valve, the field generated by the current does not change the magnetic field at the free layer. There is, however, magnetic field present at the free layer due to the pinned layers. Thus, the MR and the signal of the conventional dual spin valve are also not symmetric.

Accordingly, what is needed is a system and method for providing a thermally stable MR head. It would also be desirable for the MR head to be symmetric and have a wide linear range. The present invention addresses such a need.

SUMMARY OF THE INVENTION

The present invention provides a method and system for providing a magnetoresistive sensor. The method and system comprise providing a first pinned layer, providing a first spacer layer above the first pinned layer, and providing a free layer above the first spacer layer. The method and system further comprise providing a second spacer layer above the free layer and providing a second pinned layer above the second spacer layer. The first pinned layer includes a first magnetic layer and a second magnetic layer separated by a first nonmagnetic layer. The first magnetic layer is antiferromagnetically coupled with the second magnetic layer. The second pinned layer includes a third magnetic layer and a fourth magnetic layer separated by a second nonmagnetic layer. The third magnetic layer is antiferromagnetically coupled with the fourth magnetic layer. The first pinned layer and the second pinned layer are pinned by a current carried by the magnetoresistive head during use. In one aspect, the second pinned layer includes a fifth magnetic layer and a third nonmagnetic layer separating the fifth magnetic layer from the fourth magnetic layer. The fifth magnetic layer and the fourth magnetic layer are antiferromagnetically coupled.

According to the system and method disclosed herein, the present invention provides a magnetoresistive sensor which is more thermally stable, can behave more symmetrically with respect to current, and can have a wider linear range.

DETAILED DESCRIPTION OF THE INVENTION

The present invention relates to an improvement in magnetoresistive sensors. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 1:
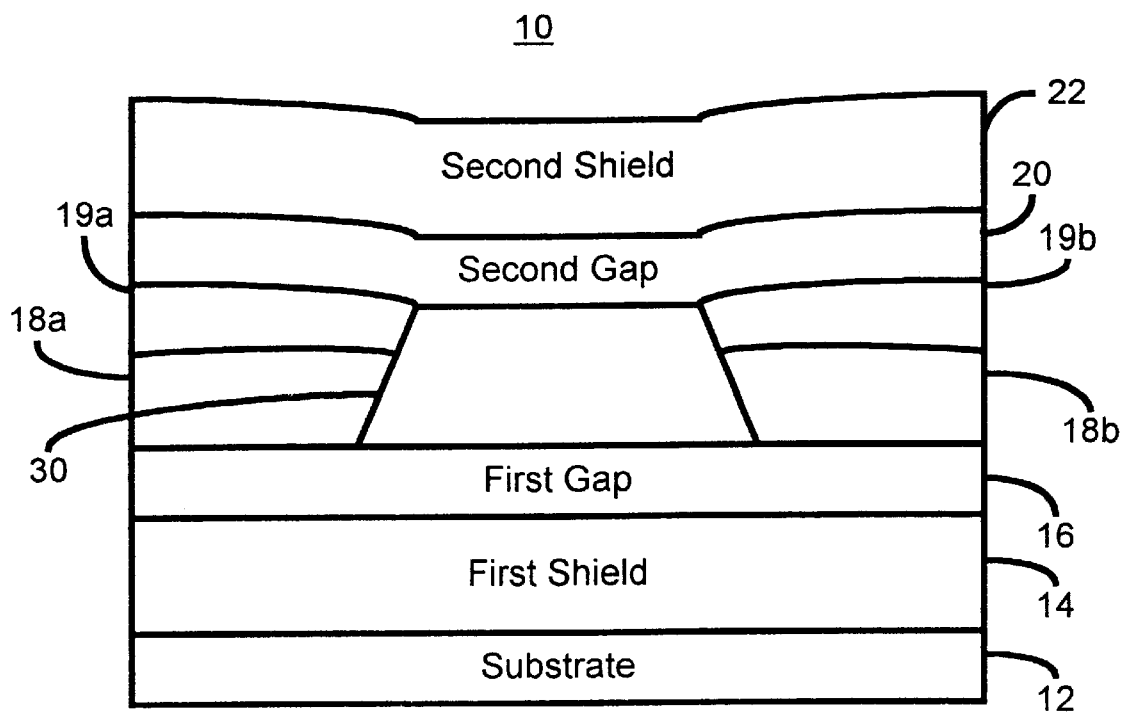
FIG. 1 is a diagram of a conventional magnetoresistive head.

FIG. 1 is a block diagram of a conventional magnetoresistance ("MR") head 10. The MR head 10 includes a first shield 14 formed on a substrate 12. The MR head 10 also includes a first gap 16 separating an MR sensor 30 from the first shield 14. The MR head 10 also includes a pair of hard bias layers 18a and 18b. The hard bias layers 18a and 18b magnetically bias layers in the NMR element 30. The NMR head 10 also includes lead layers 19a and 19b, which conduct current to and from the MR element 30. A second gap 20 separates the MR sensor 30 from a second shield 22. When brought in proximity to a recording media (not shown), the MR head 10 reads data based on a change in the resistance of the MR sensor 30 due to the field of the recording media.

Figure 2A:
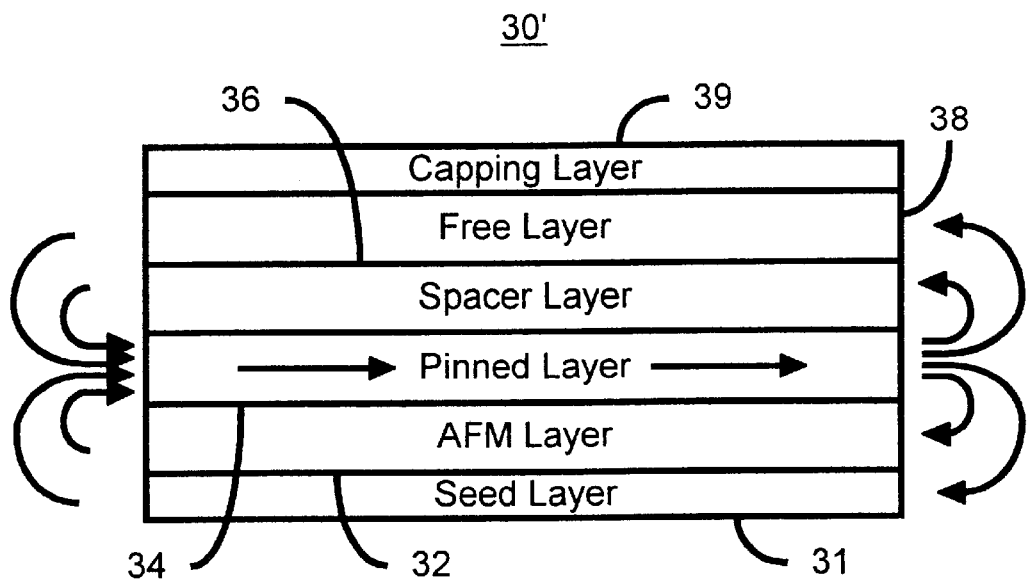
FIG. 2A is a diagram of a conventional spin valve.

In some MR heads 10, the MR sensor 30 uses giant magnetoresistance ("GMR") in order to read stored data. FIG. 2A depicts a conventional spin valve 30' which functions using GMR. The conventional spin valve 30' typically includes a seed layer 31, an antiferromagnetic ("AFM") layer 32. a pinned layer 34, a spacer layer 36, a free layer 38, and a capping layer 39. The seed layer is used to ensure that the material used for the AFM layer 32 has the appropriate crystal structure and is antiferromagnetic in nature. The spacer layer 36 is a nonmagnetic metal, such as copper. The pinned layer 34 and the free layer 38 are magnetic layers, such as CoFe, NiFe or a combination of both. The magnetization of the pinned layer 34 is depicted by arrows in the pinned layer 34. The magnetization of the pinned layer 34 is pinned in place due to an exchange coupling between the AFM layer 32 and the pinned layer 34. The magnetization of the free layer 38 is free to rotate.

In response to a magnetic field generated by the recording media, the magnetization of the free layer 38 may change direction. However, the magnetization of the pinned layer should remain constant. The difference in the directions of the magnetization of the pinned layer 34 results in a different resistance of the conventional spin valve 30'. In other words, the change in angle between the direction of magnetization of the pinned layer 34 and the direction of magnetization of the free layer 38 causes the magnetoresistance. The change in resistance results in a signal that can be used to read data stored on the recording media.

Figure 2B:
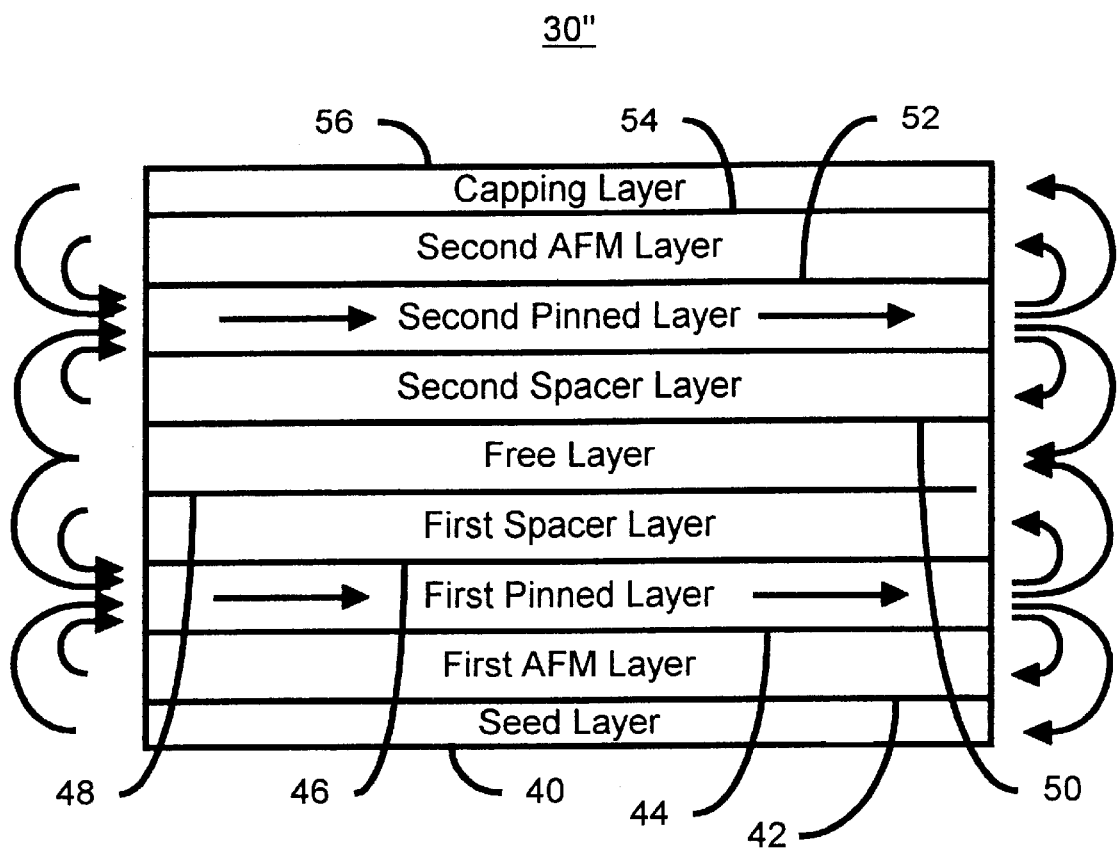
FIG. 2B is a diagram of a conventional dual spin valve.

In order to obtain an even higher GMR, a conventional dual spin valve is used. FIG. 2B depicts a conventional dual spin valve 30". The conventional dual spin valve 30" typically includes a seed layer 40, a first AFM layer 42, a first pinned layer 44, a first spacer layer 46, a free layer 48, a second spacer layer 50, a second pinned layer 52, a second AFM layer 54, and a capping layer 56. The seed layer is used to ensure that the material used for the AFM layer 42 has the appropriate crystal structure and is antiferromagnetic in nature. The first spacer layer 46 and the second spacer layer 50 are made from a nonmagnetic metal, such as copper. The first pinned layer 44, the second pinned layer 52, and the free layer 48 are magnetic layers, such as CoFe, NiFe or a combination of both. The magnetizations of the pinned layers 44 and 52 are depicted by arrows in the pinned layers 44 and 52. The magnetization of the first pinned layer 44 is pinned in place due to an exchange coupling between the first AFM layer 42 and the first pinned layer 44. The magnetization of the second pinned layer 52 is pinned in place due to an exchange coupling between the second AFM layer 54 and the second pinned layer 52. The magnetization of the free layer 48 is free to rotate.

The conventional dual spin valve 30" functions similarly to the conventional spin valve 30'. However, the conventional dual spin valve 30" has more scattering surfaces because more interfaces between magnetic and nonmagnetic materials are provided. Consequently, the conventional dual spin valve 30" is capable of generating a higher signal from a give source than a conventional spin valve 30'.

Although the conventional spin valve 30' and conventional dual spin valve 30" are capable of reading magnetic recording media, one of ordinary skill in the art will readily realize that the conventional spin valve 30' and the conventional dual spin valve 30" can operate only in a limited temperature range. The pinned layer 34 of the conventional spin valve 30' has its magnetization pinned because it is exchange coupled to the AFM layer 32. Similarly, the first pinned layer 44 and the second pinned layer 52 of the conventional dual spin valve 30" have their magnetizations pinned because they are exchange coupled to the first AFM layer 42 and the second AFM layer 54, respectively. The exchange field between the AFM layers 32, 42, and 54 and the pinned layers 34, 44, and 52, respectively, falls to zero at the blocking temperature for the AFM layers 32, 42, and 54. Furthermore, the exchange field begins to drop off below the blocking temperature. When the exchange field begins to decrease, the ability of the AFM layers 32, 42, and 54 to pin the magnetization of the pinned layers 34, 44, and 52, respectively, decreases. The magnetization of the pinned layers 34, 44, and 52 can begin to respond to the field of the recording media. As the temperature increases, the behavior of the magnetizations of the pinned layers 34, 44, and 52 becomes similar to the behavior of the magnetizations of the free layers 38 and 48. Because the magnetizations of the pinned layers 34, 44 and 52 rotate, the change in angle between the magnetizations of the free layer 38 and 48 and the magnetizations of the pinned layers 34, 44 and 52 is reduced. Thus, the GMR, the change in resistance due to the difference in magnetization of the free layer and the pinned layer, decreases. This decreases the signal from the conventional spin valve 30' and the conventional dual spin valve 30". Consequently, the conventional spin valve 30' and the conventional dual spin valve 30" become unable to read the data stored in the recording media. The conventional spin valve 30' and the conventional dual spin valve 30" thus have a relatively low operating temperature limit.

This operating temperature limit can be extended to a temperature nearer to the blocking temperature by decreasing the magnetizations of the pinned layers 34, 44, and 52. Decreasing the magnetization of a pinned layer 34, 44, or 52 increases the exchange coupling with the AFM layer 32, 42, or 54. Typically, a decrease in magnetization is accomplished by decreasing the thicknesses of the pinned layers 34, 44, and 52. However, one of ordinary skill in the art will recognize that decreasing the thickness of the pinned layer decreases the GMR of the spin valve. Consequently, decreasing the thickness of the pinned layer 34, 44, or 52 is an undesirable mechanism for increasing the operating temperature limit.

Furthermore, one of ordinary skill in the art will also realize that even at lower temperatures, where the conventional spin valve 30' and the conventional dual spin valve 30" can be used to read data stored by recording media, the signals generated by the conventional dual spin valve 30" and the conventional spin valve 30' are not symmetric. The magnetization of the pinned layers 34, 44, and 56 create a field in the region of the free layers 38 and 48. This causes an asymmetry in the response of the conventional spin valve 30' and the conventional dual spin valve 30", as explained below.

Figure 3A:
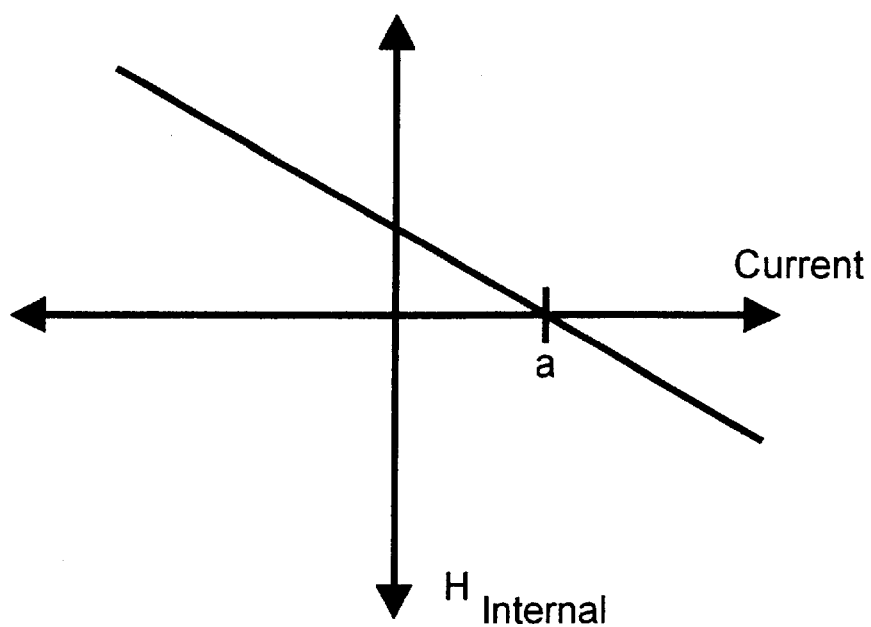
FIG. 3A is a graph depicting the magnetic field at the free layer of the conventional spin valve versus current through the conventional spin valve.

The field created by the pinned layer 34 is shown in the conventional spin valve 30' depicted in FIG. 2A. FIG. 3A depicts a graph of the internal magnetic field at the free layer 38 of the conventional spin valve 30'. The internal magnetic field is the magnetic field. due to layers within the conventional spin valve 30' and the current through the conventional spin valve 30'. Referring to FIGS. 2A and 3A, the pinned layer 34 is magnetic and, therefore, generates a magnetic field even when there is no current flowing through the conventional spin valve 30'. Current driven through the conventional spin valve 30' also generates a field within the conventional spin valve 30'. When the current is driven in one direction, chosen as the positive direction of current for convenience, the current creates a magnetic field in the opposite direction to the field created by the pinned layer 34. Thus, the internal magnetic field at the free layer 38 decreases. At a particular current, the total magnetic field at the free layer 38 is zero (point a on FIG. 3A). However, if current is driven in the opposite direction, the internal magnetic field at the free layer 38 increases. The orientation and, therefore, the MR of the conventional spin valve 30' is due to the total magnetic field at the free layer 38. The total field includes the internal field and an external field, for example from a recording media. When the conventional spin valve 30' is operated away from the point a on FIG. 3A, the nonzero internal field will be combined with any external field. Because of the asymmetry of the internal magnetic field, the total field at the free layer 38 will be asymmetric with respect to a zero external magnetic field. Thus, the response of the conventional spin valve 30' will not be symmetric with respect to Ia Is opposite magnetic fields generated by an external source, such as the recording media. Thus, the signal generated by the conventional spin valve 30' is asymmetric. Furthermore, at zero external field the free layer will already be rotated in a direction parallel to the internal field. Thus, a smaller external field in the direction of the internal field will saturate the conventional spin valve 30'. Consequently, the range of the operating current for the conventional spin valve 30' is relatively small, which is undesirable.

The conventional spin valve 30' can be operated near the point a, depicted in FIG. 3A. At this point, the total magnetic field at the free layer 38 should be due primarily to any field from a recording media. However, the signal generated by the conventional spin valve 30' is proportional to current. Using higher currents would be beneficial. However, higher currents would drive the conventional spin valve 30' away from the point at which the magnetic field at the free layer 38 due to the pinned layer 34 is balanced by the magnetic field generated by the current. In addition, if the current is driven significantly higher or the conventional spin valve 30' is operating near the blocking temperature, the magnetic field due to the current can cause the magnetization of the pinned layer 34 to flip. This adversely affects the performance of the conventional spin valve 30'.

Figure 3B:
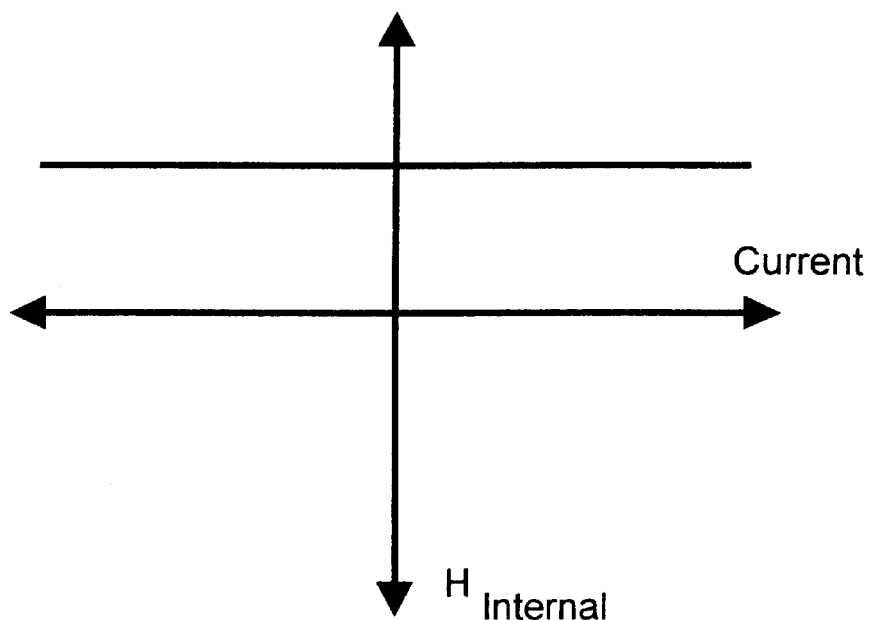
FIG. 3B is a graph depicting the magnetic field at the free layer of the conventional dual spin valve versus current through the conventional dual spin valve.

Similarly, the field created by the first pinned layer 44 and the second pinned layer 52 is shown in the conventional dual spin valve 30" depicted in FIG. 2B. FIG. 3B. depicts a graph of the internal magnetic field at the free layer 48 of the conventional dual spin valve 30". Because of the symmetry of the conventional dual spin valve 30", the field due to a current driven through the conventional dual spin valve 30" does not greatly affect the internal magnetic field. Therefore, the internal magnetic field at the free layer 48 is relatively constant. The total magnetic field at the free layer 48 includes the internal magnetic field and an external field, for example from a recording media. Because of the constant internal magnetic field at the free layer 48, the total magnetic field at the free layer 48 is nonzero when the external field is zero. When an external magnetic field in a first direction (opposite to the internal field) is applied, the internal field cancels at least a portion of the external magnetic field. The total field at the free layer 48 is thus reduced. However, when an external magnetic field in a second direction (the same direction as the internal field) is applied, the internal field adds to the external magnetic field. The total field at the free layer 48 is thus increased. Consequently, a larger signal is generated for an external field in the second direction than for an external field of the same magnitude in the first direction. Thus, the internal magnetic field causes an asymmetry in the total magnetic field at the free layer 48. Thus, the response of and signal generated by the conventional dual spin valve 30" are asymmetric with respect to the external magnetic field.

The present invention provides a method and system for providing a magnetoresistive sensor. The method and system comprise providing a first pinned layer, providing a first spacer layer above the first pinned layer, and providing a free layer above the first spacer layer. The method and system further comprise providing a second spacer layer above the free layer and providing a second pinned layer above the second spacer layer. The first pinned layer includes a first magnetic layer and a second magnetic layer separated by a first nonmagnetic layer. The first magnetic layer is antiferromagnetically coupled with the second magnetic layer. The second pinned layer includes a third magnetic layer and a fourth magnetic layer separated by a second nonmagnetic layer. The third magnetic layer is antiferromagnetically coupled with the fourth magnetic layer. The first pinned layer and the second pinned layer are pinned by a current carried by the magnetoresistive head during use. In one aspect, the second pinned layer includes a fifth magnetic layer and a third nonmagnetic layer separating the fifth magnetic layer from the fourth magnetic layer. The fifth magnetic layer and the fourth magnetic layer are antiferromagnetically coupled.

The present invention will be described in terms of particular materials used and a particular configuration of an MR head. However, one of ordinary skill in the art will readily recognize that this method and system will operate effectively for other materials and other head configurations consistent with the present invention.

Figure 4:
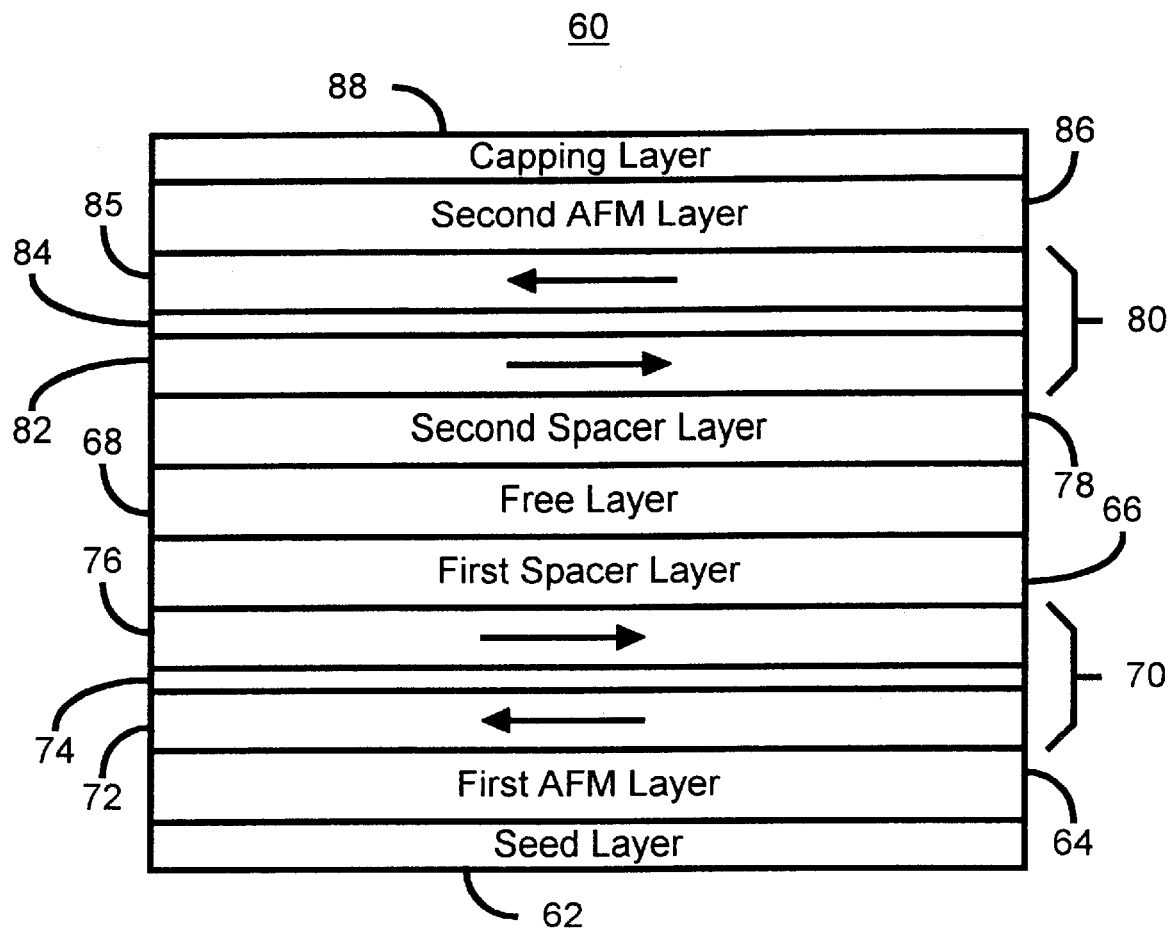
FIG. 4 is a diagram of a dual spin valve having synthetic pinned layers.

FIG. 4 depicts a more recently developed conventional dual spin valve 60. The dual spin valve 60 can be used in place of the MR sensor 30 in the MR head 10 shown in FIG. 1. Referring back to FIG. 4, the dual spin valve 60 includes a seed layer 62, a first AFM layer 64, a first synthetic pinned layer 70, a first spacer layer 66, a free layer 68, a second spacer layer 78, a second synthetic pinned layer 80, a second AFM layer 86, and a capping layer 88. The seed layer 62 is used to ensure that the material used for the first AFM layer 64 has the appropriate crystal structure and is antiferromagnetic. The first spacer layer 66 and the second spacer layer 78 are made from a nonmagnetic metal, such as copper. The free layer 68 is made from a magnetic material, such as CoFe. The first synthetic pinned layer 70 includes two magnetic layers 72 and 76 separated by a nonmagnetic layer 74. Similarly, the second synthetic pinned layer 80 includes two magnetic layers 82 and 85 separated by a nonmagnetic layer 84. The magnetizations of the magnetic layers 72, 76, 82 and 85 are depicted by arrows in the magnetic layers 72, 76, 82 and 85. The thickness of the nonmagnetic layer 74 is set so that the magnetic layers 72 and 76 are antiferromagnetically coupled. The magnetic layers 82 and 85 are coupled antiferromagnetically because the thickness of the nonmagnetic layer 84 is similarly set. The magnetizations of the magnetic layers 72 and 85 are pinned by antiferromagnetic layers 64 and 86, respectively.

The magnetic layers 72 and 76 of the first synthetic pinned layer 70 are antiferromagnetically coupled. Similarly, the magnetic layers 82 and 85 of the second synthetic pinned layer 80 are antiferroinagnetically coupled. The net magnetization of the synthetic pinned layers 70 and 80 is the sum of the magnetizations of the magnetic layers 72 and 76 and 82 and 85, respectively. Because of the antiferromagnetic coupling between the magnetic layers 72 and 76 and between the magnetic layers 82 and 85, the net magnetization of the first synthetic pinned layer 70 and the second synthetic pinned layer 80, respectively, can be greatly reduced.

The antiferromagnetic coupling of the magnetic layers 72 and 76 and 82 and 85 improves the performance of the dual spin valve 60 at some temperatures. The exchange field between an AFM layer 64 or 86 and a synthetic pinned layer 70 or 80 is proportional to the reciprocal of the net magnetization of the pinned layer 70 or 80. The reduction in the net magnetization of the synthetic pinned layer 70 and 80 increases the exchange coupling between the synthetic pinned layers 70 and 80 and the AFM layers 64 and 86. The dual spin valve 60 may, therefore, be operated at temperatures closer to the blocking temperature. The operating temperature range of the dual spin valve 60 is, therefore, increased. The decrease in the net magnetizations of the synthetic pinned layers 70 and 80 also reduces the field generated by the synthetic pinned layers 70 and 80. The internal magnetic field at the free layer 68 may also be greatly reduced. Thus, the asymmetry in the response of the dual spin valve 60 can be reduced. Furthermore, higher currents can be used to drive the dual spin valve 60 than a conventional spin valve. Furthermore, more scattering surfaces are provided in the dual spin valve 60. Thus, the dual spin valve 60 has a higher signal than a conventional spin valve.

Although the dual spin valve 60 functions well, one of ordinary skill in the art will readily realize that the conventional dual spin valve 60 is still limited by the blocking temperature of the antiferromagnetic layers 64 and 86. Thus, the conventional dual spin valve 60 has a relatively low operating temperature limit.

Figure 5A:
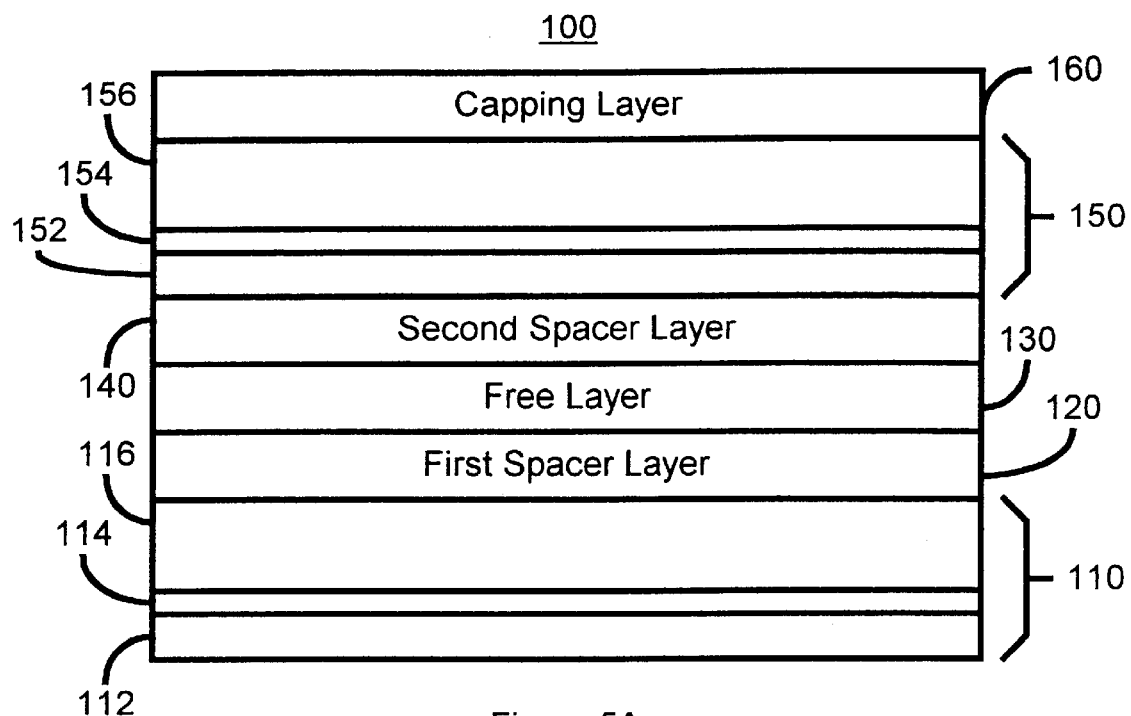
FIG. 5A is a block diagram illustrating a first embodiment of a dual spin valve in accordance with the present invention.

To more particularly illustrate the method and system in accordance with the present invention, refer now to FIG. 5A, depicting a first embodiment of a dual spin valve 100 in accordance with the present invention. The dual spin valve 100 includes a first pinned layer 110, a first spacer layer 120, a free layer 130, second spacer layer 140, a second pinned layer 150, and an optional capping layer 160. The spacer layers 120 and 140 are preferably made of copper. The free layer 130 and pinned layers 110 and 150 are magnetic.

The first pinned layer 110 includes magnetic layers 112 and 116 separated by a nonmagnetic layer 114. The magnetic layer 116 is slightly thicker and has a slightly higher magnetic moment than the magnetic layer 112. The thickness of spacer layer 114 is set to ensure that the magnetic layers 112 and 116 are antiferromagnetically coupled. The spacer layer 114 is preferably made of ruthenium. Similarly, the second pinned layer 150 includes magnetic layers 152 and 156 separated by a nonmagnetic layer 154. The magnetic layer 156 is slightly thicker and has a slightly higher magnetic moment than the magnetic layer 152. The thickness of spacer layer 154 is set to ensure that the magnetic layers 152 and 156 are antiferromagnetically coupled. The spacer layer 154 is preferably made of ruthenium. In a preferred embodiment, the net moments of the pinned layers 110 and 150 are approximately zero.

Figure 5B:
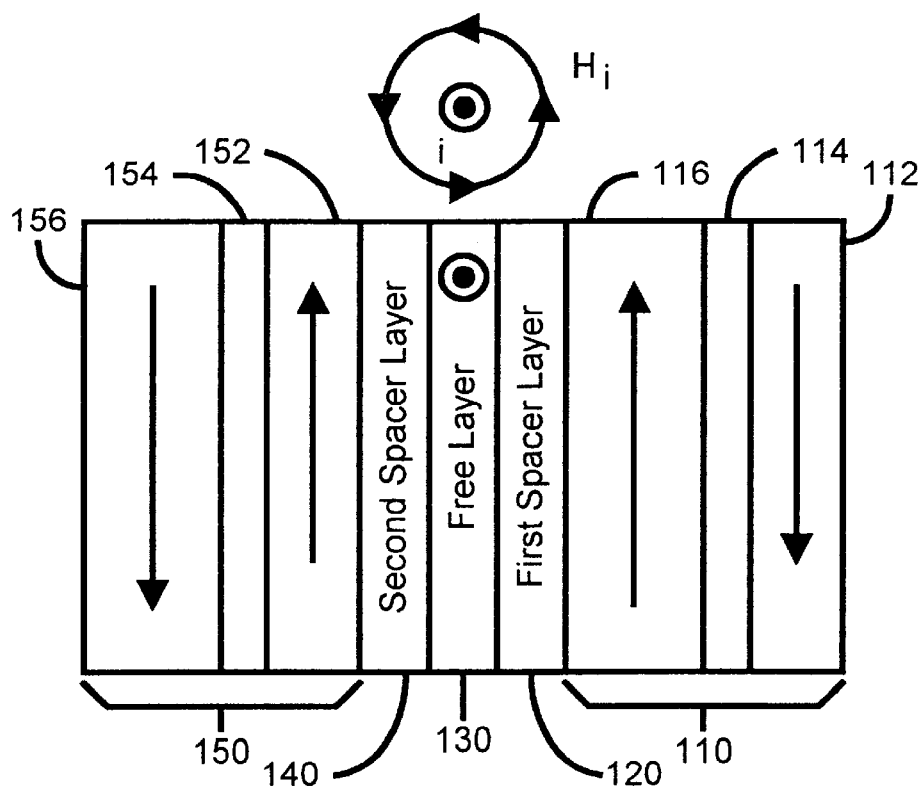
FIG. 5B is a diagram depicting the magnetic fields due to the current driven through the first embodiment of a dual spin valve in accordance with the present invention.

FIG. 5B depicts another view of a portion of the first embodiment of the dual spin valve 100 when a current, i, is driven through the dual spin valve 100. The current is depicted as being in the free layer 130. The current is, however, generally distributed throughout the pinned layers 110 and 150, the spacer layers 120 and 140, and the free layer 130. However, the current may not be evenly distributed throughout the pinned layers 110 and 150, the spacer layers 120 and 140, and the free layer 130. The magnetizations of the magnetic layers 112, 116, 152 and 156 are depicted by arrows in the magnetic layers 112, 116, 152 and 156.

The magnetic field, $H_i$, generated by the current is used to pin the magnetizations of the pinned layers 110 and 150 during use of the spin valve 100. Because the current is out of the plane of the page the magnetic field generated by the current is in a counter-clockwise direction. Furthermore, because the current is distributed through the pinned layers 110 and 150, the free layer 130, and the spacer layers 120 and 140, the magnetic field due to the current is generally highest towards the outer edges of the pinned layers 110 and 150. Because the large magnetic field is downward at the magnetic layer 156, the magnetization of the magnetic layer 156 is downward. The magnetization of the magnetic layer 152 is up because the magnetic layer 152 is antiferromagnetically coupled with the thicker magnetic layer 156. Thus, the net moment of the second pinned layer 150 is also downward, in the direction of the magnetic field generated by the current. Similarly, the magnetic field generated by the current is upward at the first pinned layer 110. Consequently, the magnetization of the thicker magnetic layer 116 is upward. It is believed that the magnetization of the magnetic layer 116, rather than the magnetization of the magnetic layer 112, will be upward because the magnetic layer 116 is thicker and, therefore, has a higher magnetic moment. The magnetization of the magnetic layer 112 is downward because the magnetic layer 112 is antiferromagnetically coupled to the thicker magnetic layer 116. The net moment of the first pinned layer 110 is upward, in the direction of the magnetic field generated by the current. Consequently, the moments of the pinned layers 110 and 150, and their components, are pinned by the magnetic field generated by the current.

Because the current is used to pin the magnetization of the pinned layers 110 and 150, the operating temperature limit of the dual spin valve 100 is increased. The dual spin valve 100 does not rely on an exchange coupling with antiferromagnetic layers to pin the pinned layers 110 and 150. Therefore, the blocking temperature of an antiferromagnetic layer may not limit the operation of the dual spin valve 100. Consequently, the dual spin valve 100 can operate at a higher temperature than the conventional spin valve 30', the conventional dual spin valve 30" or the more recently developed conventional dual spin valve 60. In addition, higher currents can be used to drive the dual spin valve 100 without adversely affecting the pinning of the pinned layers 110 and 150. The pinning may actually be improved with increasing current. This is because the current is used to pin the moments of the pinned layers 110 and 150. As a result, the dual spin valve 100 can provide a higher signal. There is also no antiferromagnetic layer to shunt current away from the scattering surfaces between the pinned layers 110 and 150. Thus, the signal of the dual spin valve 100 is further increased.

Furthermore, the magnetization of the pinned layers 110 and 150 are in opposite directions. This may substantially eliminate the internal field at the free layer 130 due to the pinned layers 110 and 150. Thus, the dual spin valve 100 is symmetric with respect to zero external magnetic field. The bias point of the dual spin valve 100 is also relatively independent of current because the current need not be used to cancel the internal field due to the pinned layers 110 and 150. This also results in a wider linear dynamic range.

The dual spin valve 100 also has a higher signal to noise ratio than a conventional spin valve. The signal provided by the dual spin valve 100 is proportional to the GMR. The dual spin valve has a higher GMR than the conventional spin valve because the dual spin valve 100 has more scattering surfaces. Furthermore, noise is proportional to the square root of the resistance. The resistance of a dual spin valve is smaller than that of a single spin valve. Thus, the signal to noise ratio of the dual spin valve 100 is increased.

Figure 6A:
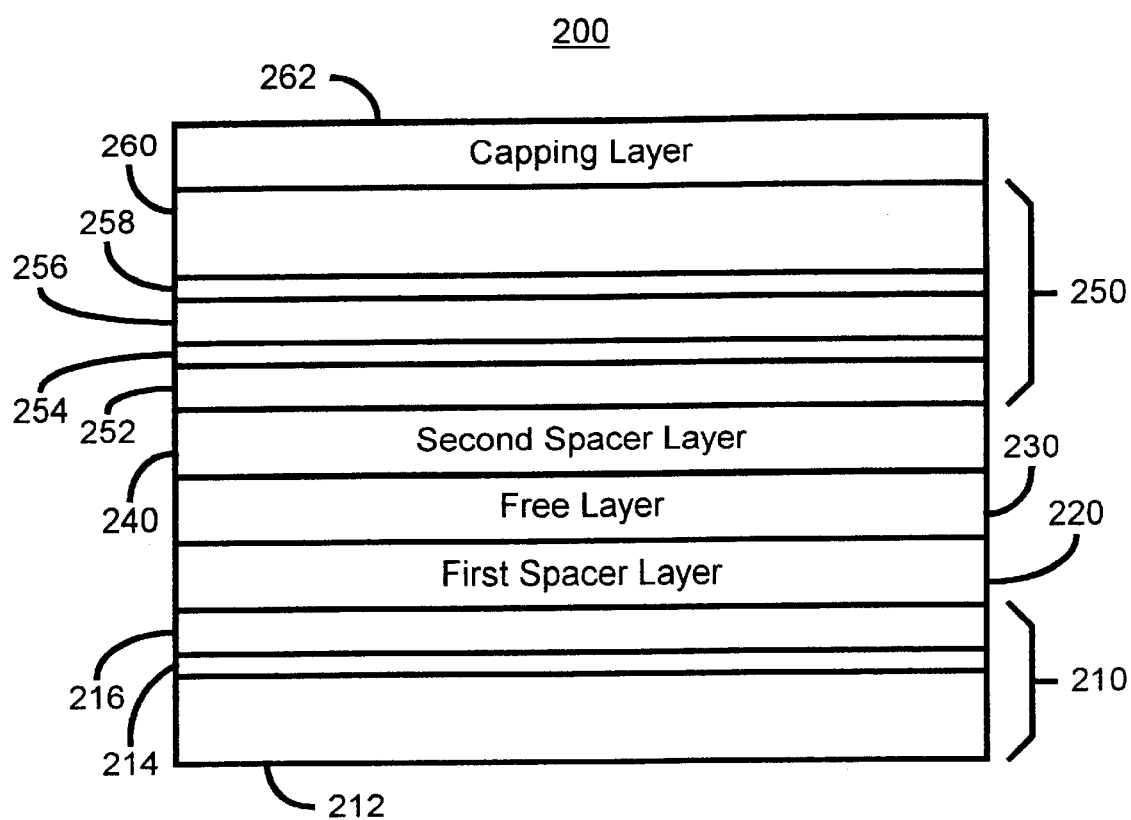
FIG. 6A is a block diagram illustrating a second embodiment of a dual spin valve in accordance with the present invention.

FIG. 6A depicts a second, preferred, embodiment of a dual spin valve 200 in accordance with the present invention. The dual spin valve 200 includes a first pinned layer 210, a first spacer layer 220, a free layer 230, second spacer layer 240, a second pinned layer 250, and an optional capping layer 262. The spacer layers 220 and 240 are preferably made of copper. The free layer 230 and pinned layers 210 and 250 are magnetic.

The first pinned layer 210 includes magnetic layers 212 and 216 separated by a nonmagnetic layer 214. The magnetic layer 212 is slightly thicker and has a slightly higher magnetic moment than the magnetic layer 216. The thickness of spacer layer 214 is set to ensure that the magnetic layers 212 and 216 are antiferromagnetically coupled. The spacer layer 214 is preferably made of ruthenium. Similarly, the second pinned layer 250 includes magnetic layers 252, 256, and 260 separated by nonmagnetic layers 254 and 258. The thicknesses of the magnetic layers 252, 256, and 260 are set so that the combinations of the magnetic moments of the layers 252 and 260 is larger than the magnetic moment of the magnetic layer 256. Preferably, the magnetic layer 260 is the thickest of the magnetic layers 252, 256, and 260. The thicknesses of spacer layers 254 and 258 are set to ensure that the magnetic layers 252, 256, and 260 are antiferromagnetically coupled. The spacer layers 254 and 258 are preferably made of ruthenium. In a preferred embodiment, the combined magnetic moments of the pinned layers 210 and 250 are approximately zero.

Figure 6B:
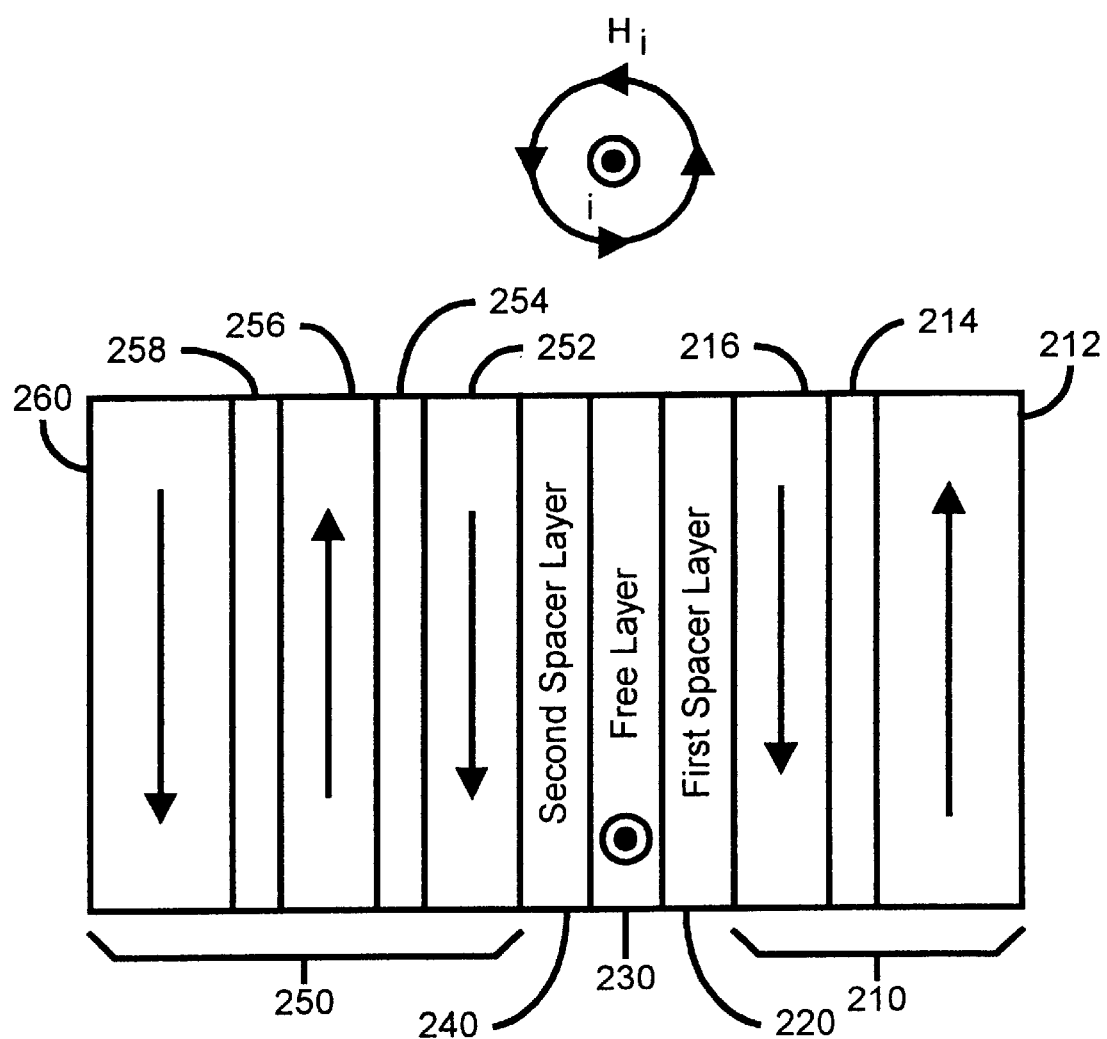
FIG. 6B is a diagram depicting the magnetic fields due to the current driven through the second embodiment of a dual spin valve in accordance with the present invention.

FIG. 6B depicts another view of a portion of the second embodiment of the dual spin valve 200 when a current, i, is driven through the dual spin valve 200. The current is depicted as being in the free layer 230. The current is, however, generally distributed throughout the pinned layers 210 and 250, the spacer layers 220 and 240, and the free layer 230. However, the current may not be evenly distributed throughout the pinned layers 210 and 250, the spacer layers 220 and 240, and the free layer 230. The magnetizations of the magnetic layers 212, 216, 252, 256 and 260 are depicted by arrows in the magnetic layers 212, 216, 252, 256 and 260.

The magnetic field, $H_i$, generated by the current is used to pin the magnetizations of the pinned layers 210 and 250 during use of the spin valve 200. Because the current is out of the plane of the page the magnetic field generated by the current is in a counter-clockwise direction. Furthermore, because the current is distributed through the pinned layers 210 and 250, the free layer 230, and the spacer layers 220 and 240, the magnetic field due to the current is generally highest towards the outer edges of the pinned layers 210 and 250. Because the large magnetic field is upward at the magnetic layer 212, the magnetization of the magnetic layer 212 is upward. The magnetization of the magnetic layer 216 is down because the magnetic layer 216 is antiferromagnetically coupled with the thicker magnetic layer 212. Thus, the net magnetic moment of the first pinned layer 210 is also upward, in the direction of the magnetic field generated by the current. Similarly, the magnetic field generated by the current is downward at the second pinned layer 250. The magnetization of the thicker magnetic layer 260 is downward because the large magnetic field is downward at the thicker magnetic layer 260. The magnetization of the magnetic layer 256 is upward because the magnetic layer 256 is antiferromagnetically coupled to the thicker magnetic layer 260. The magnetization of the magnetic layer 252 is downward because the magnetic layer 252 is antiferromagnetically coupled to the magnetic layer 256. The net moment of the second pinned layer 250 is downward, in the direction of the magnetic field generated by the current. Consequently, the moments of the pinned layers 210 and 250, and their components, are pinned by the magnetic field generated by the current.

The dual spin valve 200 has similar benefits as the dual spin valve 100. Therefore, the operating temperature limit of the dual spin valve 200 is increased. In addition, higher currents can be used to drive the dual spin valve 200 without adversely affecting the pinning of the pinned layers 210 and 250. Higher currents may improve the pinning of the pinned layers 210 and 250. As a result, the dual spin valve 200 can provide a higher signal. There is also no antiferromagnetic layer to shunt current away from the scattering surfaces between the pinned layers 210 and 250. Thus, the signal of the dual spin valve 200 is further increased. The combined magnetic moments of the pinned layers 210 and 250 can also be reduced to approximately zero, substantially eliminating the internal field at the free layer 230 due to the pinned layers 210 and 250. Thus, the dual spin valve 200 is symmetric with respect to a zero external magnetic field. The bias point of the dual spin valve 200 is also relatively independent of current because the magnetic field generated by the current is very small at the free layer 230. The dual spin valve 200 also has a higher signal to noise ratio than a conventional spin valve because the dual spin valve has a higher signal than the conventional spin valve 30'. Noise is proportional to the square root of the resistance. The resistance of a dual spin valve is comparable to that of a single spin valve. Thus, the signal to noise ratio of the dual spin valve 200 is increased.

The dual spin valve 200 has an additional benefit. As depicted in FIG. 6, the thicker magnetic layers are the layers 212 and 260. Consequently, the thicker magnetic layers 212 and 260 are at the outer edges of the dual spin valve 200, where the magnetic field generated by the current is greater. The thickest layers 212 and 260 have magnetizations in the direction of the magnetic field generated by the current and are located where the magnitude of the magnetic field generated by the current is largest. Consequently, the magnetizations of the layers 212 and 260 are more firmly pinned in the desired directions. The magnetizations of magnetic layers 216 and 256 antiferromagnetically coupled with the more stable magnetic layers 212 and 260, respectively, are thus more firmly pinned in the desired direction. Similarly, the magnetization of the magnetic layer 252 is more firmly fixed because the magnetic layer 252 is antiferromagnetically coupled to the magnetic layer 256. The dual spin valve 200 is thus more stable than the dual spin valve 100.

Figure 7:
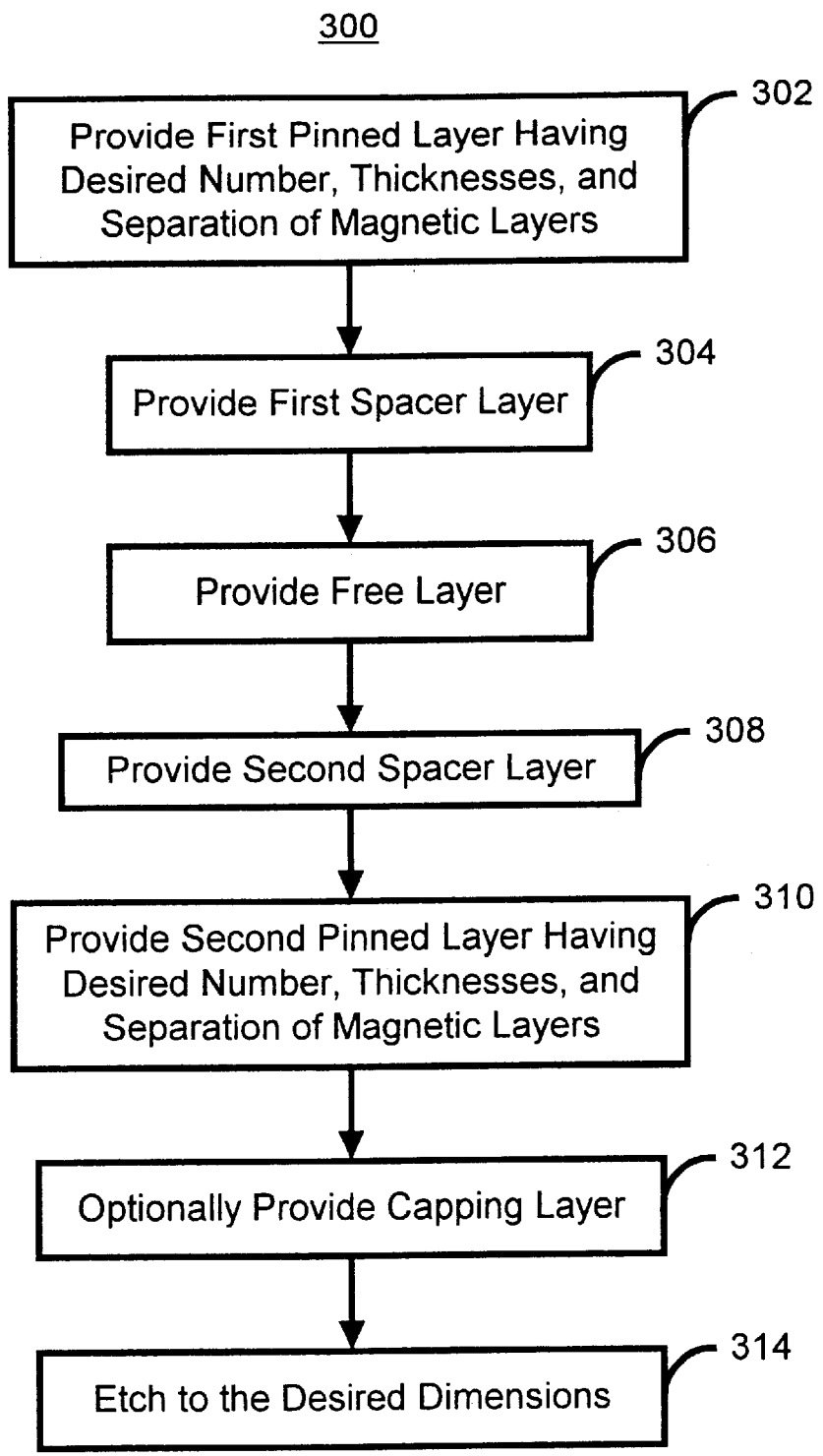
FIG. 7 is a flow chart depicting one embodiment of a method for providing a dual spin valve in accordance with the present invention.

FIG. 7 depicts one embodiment of a method 300 for providing a dual spin valve 100 or the dual spin valve 200 in accordance with the present invention. The method 300 can be utilized in the processing of the MR head 10. Thus, the method 300 may commence after the first gap 16, depicted in FIG. 1, is provided. Referring back to FIGS. 7, 5B and 6B, the first pinned layer 110 or 210 is provided, via step 302. In a preferred embodiment, step 302 includes providing the desired number of magnetic layers separated by spacer layers of the appropriate thickness and ensuring that the layers have the desired thickness. For example, step 302 can include providing the layers 112, 114, and 116 or the layers 212, 214, and 216. In one embodiment, the magnetic layers 112 and 116 or 212 and 216 are CoFe, while the nonmagnetic layer is Ru or Cu. Step 302 also includes ensuring that the nonmagnetic layer 114 or 214 is thin enough to allow for antiferromagnetic coupling between the magnetic layers 112 and 116 or 212 and 216, respectively. The first spacer layer 120 or 220 is then provided, via step 304. In a preferred embodiment, step 304 includes providing a Cu spacer layer. The magnetic free layer 130 or 230 is then provided, via step 306. In a one embodiment, the free layer 130 or 230 is CoFe. The second spacer layer 140 or 240 is provided, via step 308. In a preferred embodiment, step 308 includes providing a Cu spacer layer. The second pinned layer 150 or 250 is provided, via step 310. In a preferred embodiment, step 310 includes providing the desired number of magnetic layers, separated by spacer layers of the appropriate thickness, and ensuring that the magnetic layers have the desired thickness. For example, step 310 can include providing the layers 152, 154, and 156 or the layers 252, 254, 256, 258 and 260. In one embodiment, the magnetic layers 152 and 156 or 252, 256, and 260 are CoFe, while the nonmagnetic layers 154 or 254 and 258 are Ru or Cu. Step 310 also includes ensuring that the nonmagnetic layers 154 or 254 and 256 are thin enough to allow for antiferromagnetic coupling between the magnetic layers 152 and 156 or 252, 256, and 260, respectively. A capping layer 160 or 262 may optionally be provided, via step 312. The layers are then etched to the desired to dimensions, via step 314. Thus, the dual spin valve 100 or 200 is provided. The fabrication of the MR head 10 may then continue as desired.

A method and system has been disclosed for providing a magnetoresistance sensor that has a high operating temperature limit and which has little asymmetry. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetoresistive sensor comprising:
a first pinned multilayer including a first magnetic layer and a second magnetic layer separated by a first nonmagnetic layer, the first magnetic layer being antiferromagnetically coupled with the second magnetic layer;
a free layer;
a first spacer layer disposed between the first pinned multilayer and the free layer;
a second pinned multilayer including a third magnetic layer, a fourth magnetic layer, and a fifth magnetic layer, the fourth magnetic layer separated from the third magnetic layer by a second nonmagnetic layer, the fifth magnetic layer being separated from the fourth magnetic layer by a third nonmagnetic layer, the third magnetic layer being antiferromagnetically coupled with the fourth magnetic layer, the fifth magnetic layer being antiferromagnetically coupled with the fourth magnetic layer; and
a second spacer layer disposed between the free layer and the second pinned multilayer;
wherein the first pinned multilayer and the second pinned multilayer are pinned by a current carried by the magnetoresistive sensor during use.

2. The magnetoresistive sensor of claim 1 wherein the second magnetic layer is adjacent to the first spacer layer and the third magnetic layer is adjacent to the second spacer layer, wherein the first magnetic layer is thicker than the second magnetic layer.

3. The magnetoresistive sensor of claim 1 wherein the second magnetic layer is adjacent to the first spacer layer and the third magnetic layer is adjacent to the second spacer layer, wherein the first magnetic layer is thicker than the second magnetic layer, and wherein the fifth magnetic layer is thicker than the third magnetic layer or the fourth magnetic layer.

4. The magnetoresistive sensor of claim 1 wherein the total magnetic moment of the first pinned multilayer and the second pinned multilayer is approximately zero.

5. The magnetoresistive sensor of claim 1 wherein the first, second, third, and fourth magnetic layers include CoFe.

6. The magnetoresistive sensor of claim 1 wherein the first and second spacer layers include a nonmagnetic conductive material.

7. A method for providing a magnetoresistive sensor comprising the steps of:
  (a) providing a first pinned multilayer including a first magnetic layer and a second magnetic layer separated by a first nonmagnetic layer, the first magnetic layer being antiferromagnetically coupled with the second magnetic layer;
  (b) providing a first spacer layer above the first pinned multilayer;
  (c) providing a free layer above the first spacer layer;
  (d) providing a second spacer layer above the free layer; and
  (e) providing a second pinned multilayer above the second spacer layer, the second pinned multilayer including a third magnetic layer, a fourth magnetic layer, and a fifth magnetic layer, the fourth magnetic layer being separated from the third magnetic layer by a second nonmagnetic layer, the fifth magnetic layer being separated from the fourth magnetic layer by a third nonmagnetic layer, the third magnetic layer being antiferromagnetically coupled with the fourth magnetic layer, the fifth magnetic layer being antiferromagnetically coupled with the fourth magnetic layer, wherein the first pinned multilayer and the second pinned multilayer are pinned by a current carried by the magnetoresistive sensor during use.

8. The method of claim 7 wherein the second magnetic layer is adjacent to the first spacer layer and the third magnetic layer is adjacent to the second spacer layer, wherein the first magnetic layer is thicker than the second magnetic layer.

9. The method of claim 7 wherein the second magnetic layer is adjacent to the first spacer layer and the third magnetic layer is adjacent to the second spacer layer, wherein the first magnetic layer is thicker than the second magnetic layer, and wherein the fifth magnetic layer is thicker than the third magnetic layer or the fourth magnetic layer.

10. The method of claim 7 wherein the total magnetic moment of the first pinned multilayer and second pinned multilayer is approximately zero.

11. The method of claim 7 wherein the first, second, third, and fourth magnetic layers include CoFe.

12. The method of claim 7 wherein the first and second spacer layers include a nonmagnetic conductive material.

* * * * *